United States Patent

Misiano et al.

Patent Number: 5,900,271
Date of Patent: May 4, 1999

[54] METHOD FOR MAKING PLASTIC FILM WITH BARRIER LAYERS

[75] Inventors: Carlo Misiano; Enrico Simonetti, both of Rome; Francesco Staffeti, Villagrande di Torninparte, all of Italy

[73] Assignee: CE.TE.V. Centro Technologie Del Vuoto, Carsoli, Italy

[21] Appl. No.: 08/937,314

[22] Filed: Sep. 22, 1997

Related U.S. Application Data

[62] Division of application No. 08/640,095, Apr. 30, 1996, Pat. No. 5,704,980, which is a continuation of application No. 08/537,508, Sep. 28, 1995, abandoned.

[30] Foreign Application Priority Data

Sep. 29, 1994 [IT] Italy ................................ RM94A0626

[51] Int. Cl.$^6$ .................................................. C23C 16/00
[52] U.S. Cl. ........................... 427/8; 427/250; 427/255.3; 427/255.7; 427/537; 427/539; 427/576
[58] Field of Search .................. 427/537.8, 539, 427/255.7, 576, 250, 255.3; 118/699, 723 R, 718, 715

[56] References Cited

U.S. PATENT DOCUMENTS 4,197,337  4/1980  Di Biasi et al. ........................ 427/270

FOREIGN PATENT DOCUMENTS

| 0 082 001 | 6/1983 | European Pat. Off. . |
|---|---|---|
| 0 437 946 A2 | 7/1991 | European Pat. Off. . |
| 0 642 989 A1 | 3/1995 | European Pat. Off. . |
| 43 08 632 A1 | 9/1994 | Germany . |
| WO 82/02687 | 8/1982 | WIPO . |

OTHER PUBLICATIONS

Vol. 9, No. 222 (C–302) (1945)–Sep. 9, 1985 Formation of Oxide Layer.

*Primary Examiner*—Bernard Pianalto
*Attorney, Agent, or Firm*—Herbert Dubno

[57] ABSTRACT

A plastic wrapping film is provided with one or more aluminum layers by vapor deposition and the or each layer is only partially oxidized in an oxidizing plasma so that the resulting barrier layer is distinguishable by slight reduction in transparency but excellent prevention of penetration by moisture and oxygen.

5 Claims, 2 Drawing Sheets

METHOD FOR MAKING PLASTIC FILM WITH BARRIER LAYERS

CROSS REFERENCE TO RELATED APPLICATION

This is a file-wrapper divisional application Ser. No. 08/640,095 filed Apr. 30, 1996, U.S. Pat. No. 5,704,980, which is a continuation of application Ser. No. 08/537,508 filed Sep. 28, 1995, abandoned.

FIELD OF THE INVENTION

Our present invention relates to the formation of barrier layers on transparent film and, more particularly, to a method of forming a barrier against gas, vapor, odor and especially water vapor and oxygen on plastic film.

BACKGROUND OF THE INVENTION

The formation of barrier layers on plastic film is highly desirable to produce a wrapping material for the protection of food products or other articles against deterioration by excluding gas, liquids, vapors, odors and especially water vapor and oxygen, from the package.

The barrier layers can be composed of, for example, aluminum oxide or can contain aluminum oxide.

In commonly assigned copending application Ser. No. 08/258,978 filed Jun. 10, 1994 (now U.S. Pat. No. 5,462,602, issued Oct. 31, 1995) and its divisional application Ser. No. 08/501,532 filed Jul. 12, 1995 (now U.S. Pat. No. 5,571,574), both based upon Italian application RM93A 000385 filed Jun. 11, 1993, there is described a process and apparatus for continuous reactive metal deposition in which a plastic film is coated in a vacuum chamber in a system in which metal is vaporized onto the web and the coating is reacted in a reactive zone to form the metal compound.

In that system a pressure in the deposition zone is lower than the pressure in the vacuum zone so that reactive processes are favored in the latter while deposition is favored in the former. The plastic films can be coated with metal oxides or nitrides in this manner.

Mention may also be made of the commonly assigned copending application Ser. No. 08/222,690 filed Apr. 4, 1994, (U.S. Pat. 5,466,296 of Nov. 14, 1995) and its division Ser. No. 08/415,612 filed Apr. 3, 1995, (now abandoned and replaced by Ser. No. 08/659,028) both based upon Italian application RM93A 000216 filed Apr. 6, 1993 and which disclosed a thin film deposition apparatus capable of use for PECVD and sputtering techniques.

Finally mention should be made of application Ser. No. 08/025,514 filed Mar. 2, 1993, replacing Ser. No. 07/956,736 of Oct. 2, 1992 (now abandoned) which discloses the gradated barrier film of aluminum oxide and silicon oxide which has proved to be highly effective against permeation by water vapor and oxygen and yet has excellent optical properties.

While these systems have been found to be particularly effective and advantageous in the preparation of wrapping films and like damaging materials, further research into the application of barrier layers upon plastic films has shown that earlier PVD or CVD processes which directly deposit oxide coatings on such film are too expensive and too low cost efficiency for widespread use in the preparation of wrapping films with barrier layers against water vapor and oxygen penetration, especially where films of high flexibility are desirable.

While the method described in the commonly-owned Italian application RM93A 000385 and the corresponding U.S. applications has the potential of coating large volumes of film rapidly and with fully oxidized or reacted metal layers, we have found that such layers, especially consisting of aluminum oxide, are not effective as barriers against moisture and oxygen penetration or are less effective as barriers than is desirable. Of course, when combined with silicon oxide as has been described in others of the applications mentioned above, the resulting composite barrier is highly effective against moisture penetration and oxygen penetration, fully oxidized aluminum oxide layers are not as effective to a considerable degree.

Nevertheless aluminum oxide layers are highly desirable for barrier purposes if moisture and oxygen penetrability can be reduced because of the good mechanical correspondence of aluminum oxide layers on plastic film.

OBJECTS OF THE INVENTION

It is, therefore, the principal object of the present invention to provide an improved method of applying a barrier layer to a plastic film whereby drawbacks of earlier systems are obviated and a film-shaping for wrapping purposes can be fabricated with good resistance to penetration by moisture and oxygen at low cost and at high speeds.

Another object of the invention is to provide an improved apparatus for this purpose.

SUMMARY OF THE INVENTION

These objects and others which will become apparent hereinafter are attained, in accordance with the invention, by a method which involves the application of a vapor-deposited metal coating, especially an aluminum coating in at least one but preferably a succession of layers upon the plastic film and after the or each vapor deposition coating, reacting the coating metal with oxygen so that only a part of the metal is transformed to the corresponding oxide, a portion of the metal in the or each layer remaining unreacted with oxygen.

We have found that this approach does cause a very slight change in the optical properties of the barrier layer which is formed, leaving it slightly absorbent in an optical sense, but this does not appear to materially affect the quality of the film at least as a wrapping or packaging film.

Indeed, this slight optical absorbency of the or each layer resulting from the lack of full transformation to the metal oxide, especially aluminum oxide, has been found to provide a basis for controlling the process in that parameters of the coating process can be controlled to maintain that slight absorbency and thus partial oxidation of the aluminum layer.

The partial oxidation can be assured by the use of a timer or other means preventing full oxidation when the vapor-deposited metal is subjected to the oxygen plasma following the vapor coating.

The barrier film which is incompletely oxidized has slight optical absorbency without chromatic effects and surprisingly, a significant resistance to penetration by moisture and oxygen.

The essence of the present invention, therefore, is that while traditional reactive deposition techniques may be used for the aluminum oxide deposition, it is optionally assisted by plasma and/or ion activation, for suitably controlling the degree of oxidation of the deposited film, whether by automatic control via a timer, by manual control or by measuring the optical transparency of the layer.

The apparatus for practicing the invention can correspond to that of application Ser. No. 08/501,532 with multiple passes and roll-to-roll transfer of the plastic film. In that case, the metallic material can be evaporated from a crucible and deposited in a multiplicity of successive stages in small increments on the substrate, the metal being partially oxidized by passage through a zone of higher pressure, other apparatus can be used as well, the oxidizing atmosphere preferably being in the form of a plasma.

According to the invention, the following parameters can be controlled:

SPECIFIC DESCRIPTION

As can be seen from FIG. 2, a plurality of aluminum layers 10, 11 and 12, for example, may be applied in succession to a plastic film 13 greatly exaggerated in thickness in FIG. 2, to form a wrapping film. After each aluminum coating is applied, it is oxidized only partially to a maximum of 97% of full oxidation so that the resulting layer contains a stoichiometric deficiency of oxygen, i.e. less than three atoms of oxygen for every two atoms of aluminum of the layer.

While the film can be fabricated in the multipass apparatus of Ser. No. 08/501,532, in FIG. 1, we have shown in highly diagrammatic form, an apparatus for applying the barrier to a plastic film 20 supplied by a roll 21, the plastic film being wound up on a roll 22 with barrier layers on opposite surfaces thereof. Prior to application of the barrier layer, the film, e.g. of polyethylene or polyethyleneterephthalate, can be pretreated to permit the bonding of the barrier, e.g. by a flame treatment or an electrostatic discharge treatment or by mono-axial or bi-axial stretching.

In a first stage 23 of a processing line 24 which can be evacuated generally as represented by the suction pump 25, and in which the chamber is under a higher vacuum developed by a suction pump 26, the film 20 can be vapor-coated with aluminum from crucibles 27 and 28 which are electrically heated as represented by the electrodes 29 and 30 utilizing an arc discharge from a power source 31. The film itself may be heated at any point along the line as represented by an infrared heating source 31 with a controller 32.

After coating the initial layer of aluminum by vacuum deposition in this manner, the metal coatings are contacted with an oxygen plasma in a second stage chamber 33, the plasma being introduced by discharge across electrodes 34 supplied by a high voltage source 35. Oxygen is admitted into the stage 33 as represented by the oxygen tank 36.

A second aluminum layer can be applied to each partially oxidized previously applied aluminum layer in the next stage 37 in the crucibles 38 and 39 containing the aluminum which are activated by electrons or ion beams from the electron or ion-beam gun 40 or 41. A deeper vacuum than that maintained in the plasma chamber 33 is drawn in chamber 37 via the suction pump 41.

Oxygen plasma is then contacted with newly applied aluminum layers in the next stage 43 to which oxygen is admitted from the tank 44, the plasmas here being induced by magnetrons 45 and 46.

To monitor the transparency or absorbency of the barrier layer on the plastic films, sensors 47 and 48 can be provided. The sensors 47 and 48 can, for example, provide input to a controller 49 for the motor 50 driving the take-up roll 22, thereby regulating the speed of the plastic film through the system. Alternatively, the sensors may feed into a controller 51 which can regulate the heating of the film at 31 by providing an input to the power regulator 32, or can control the suction pumps chamber the film was passed over a drum chilled to −20° C. to −40° C. to cool the substrate to approximately the same temperature. For a coating thickness T in the range of 100 to 1500 angstroms, the aluminum was vapor deposited in each pass to a thickness of 0.25 T to 0.1 T. The vapor deposition was carried out by evaporation of Al onto the film from boats heated by the Joule effect with the film traversing the vapor deposition chamber at a speed up to about 12 m/s. The pressure in the vapor deposition chamber was held at $10^{-3}$ to $10^{-5}$ Torr.

Following coating with Al, partial oxidation was carried out in an oxygen plasma at the same film speed. The electrodes were energized with DC or radiofrequency current with a voltage between 50 and 2500 Volts. The atmosphere was $O_2$ or a mixture of $O_2$ and argon. The pressure in the oxidation chamber was $10^{-3}$ to $10^{-1}$ Torr. Each oxidation step was controlled by monitoring the transparency of the coated film and, in particular, such that the transmittance was less than 100% of the film transmittance but more than 70%. Preferred values of the light transmittance in the visible range were between 75% and 80%, corresponding to the transmittance in the final product.

The coated film was tested for its mechanical properties and passed adhesion, flexure (gelboflex) and delamination tests. The oxygen permeability was less than 1 cc/m²day and the water vapor permeability was less than 3 g/m²day. Fully oxidized aluminum coatings, by contrast, showed no barrier prperties with respect to water vapor. 26 and 41 regulating the pressures in chambers 33 and 37. In another alternative, the controller 51 can regulate the high-voltage source 35 generating the plasma.

In general, therefore, it can be said that the partial oxidation which is effected in the chambers 33 and 43 can be controlled by controlling at least one of the following parameters:

(a) the thickness of each single aluminum layer deposited at each pass through a deposition stage of the apparatus;

(b) the pressure and composition of the deposition and/or oxidation zones;

(c) the power and voltage for the discharge which creates the plasma;

(d) the velocity of the plasma film;

(e) the temperature of the plastic film;

(f) any possible preliminary plasma or other pretreatment of the plastic film; and (g) deposition velocity of the vaporized material.

If desired, a timer 52 may provide input to the controller 51 for automatically carrying out a predetermined program of deposition and oxidation based upon the selected parameter.

SPECIFIC EXAMPLE

The film to be coated was a 0.05 mm thick polyethyleneterephthalate film and in the vapor deposition (a) thickness of each single layer of metal (usually aluminum) deposited in each pass through the deposition zone;

(b) the pressure and composition of the atmosphere in the deposition zone or in the oxidation zone;

(c) the power and voltage which generate the discharge creating the plasma or the power of the magnetron when the plasma is microwaved activated;

(d) the velocity of the plasma film;

(e) preliminary treatment of the plastic film, e.g. electrostatic activation of the film surface or mono-axial stretching or bi-axial stretching of the plastic film; and (f) temperature of the plastic film.

BRIEF DESCRIPTION OF THE DRAWING

The above and other objects, features, and advantages will become more readily apparent from the following description, reference being made to the accompanying drawing in which.

Figure 1:
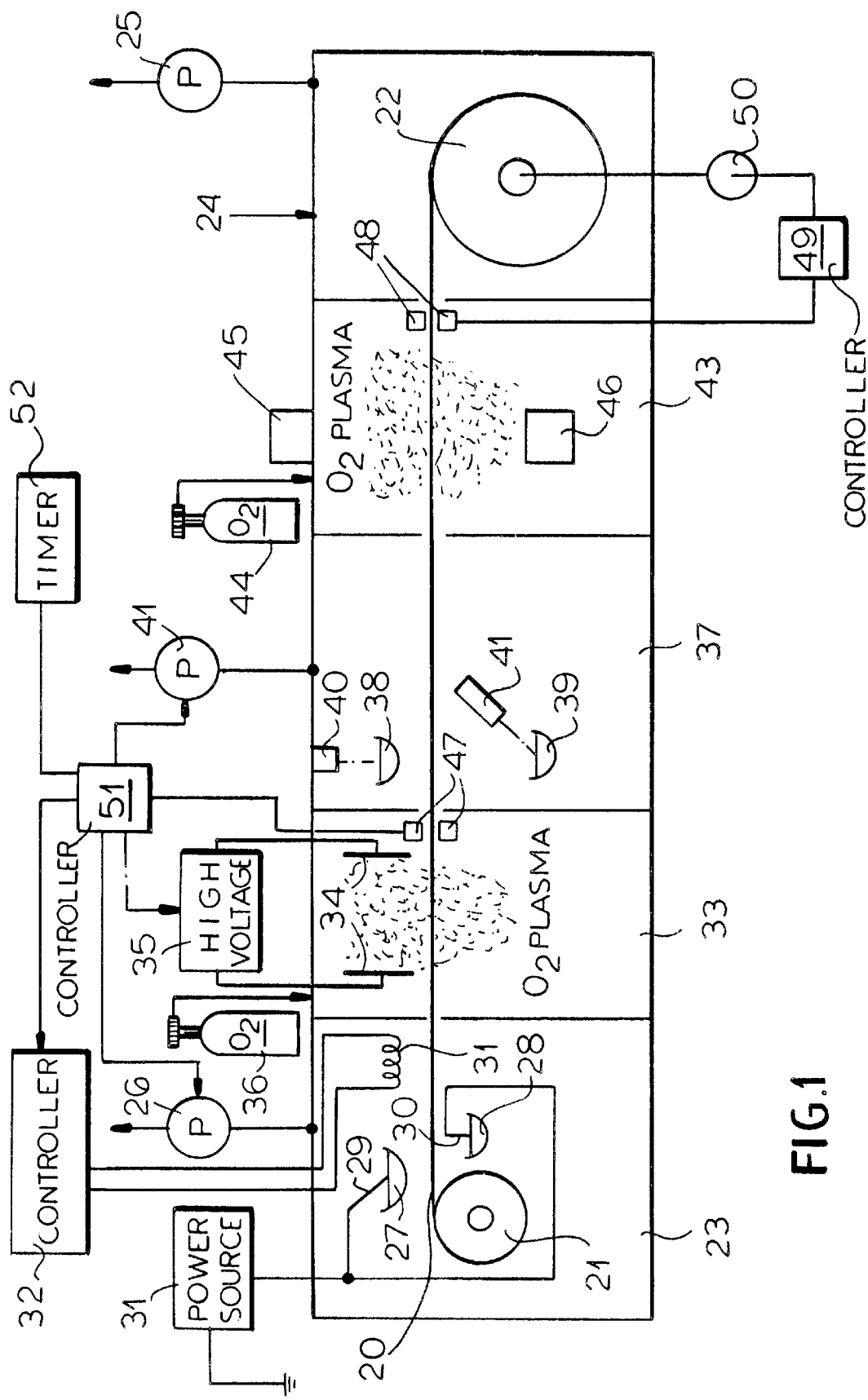
FIG. 1 is a diagram of an apparatus which can be used for practicing the method of the present invention if the apparatus of Ser. No. 08/501,532 is not used.
Figure 2:
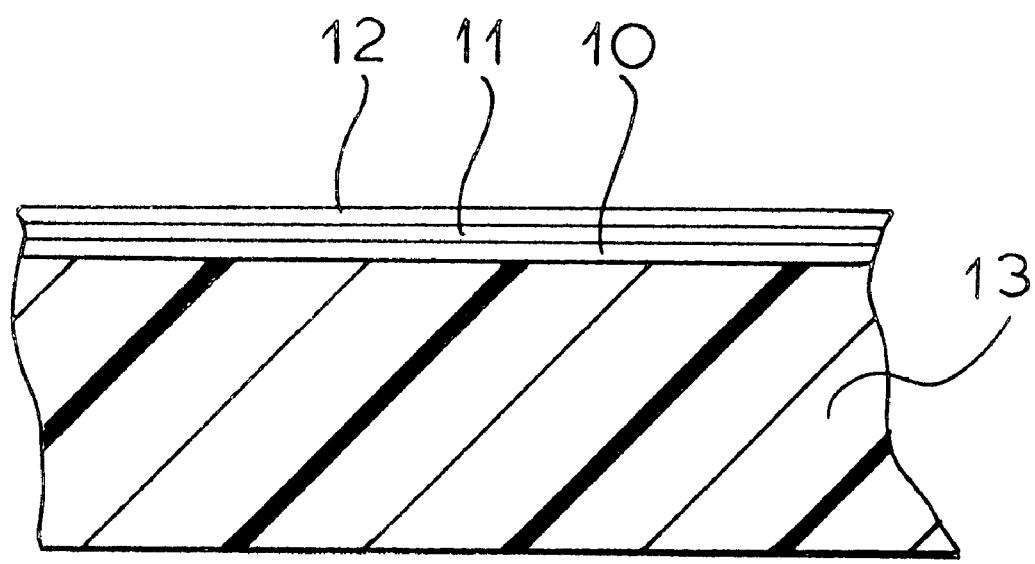
FIG. 2 is a cross sectional view through a plastic film provided with a barrier layer in accordance with the invention on only one side although two-sided coating is possible.

We claim:

1. A method of producing a plastic wrap comprising the steps of:

(a) vapor depositing upon a plastic film a plurality of aluminum layers in succession and in separate and successive passes;

(b) subjecting each of said aluminum layers to oxidation individually for each pass; and (c) controlling the oxidation of each aluminum layer on each pass so that each aluminum layer is only partially oxidized, said oxidation being controlled so that each aluminum layer is oxidized to 80 to 97% of complete oxidation.

2. The method defined in claim 1 wherein said oxidation is controlled by automatically timing a duration of oxidation of each layer.

3. The method defined in claim 1 wherein a degree of oxidation of each metallic layer is monitored by measuring transparency thereof.

4. The method defined in claim 1 wherein each of said aluminum layers is oxidized in an oxygen-containing plasma.

5. The method defined in claim 4 wherein the control is effected in step (c) by regulating at least one of the following:

(I) the thickness of each single aluminum layer deposited at each pass through a deposition stage of the apparatus;

(II) the pressure and composition of the deposition and/or oxidation zones;

(III) the power and voltage for the discharge which creates the plasma;

(IV) the velocity of the plasma film;

(V) the temperature of the plastic film;

(VI) any possible preliminary plasma or other pretreatment of the plastic film; and (VII) deposition velocity of the vaporized material.

* * * * *